(12) United States Patent
Thomasson

(10) Patent No.: US 6,404,279 B2
(45) Date of Patent: *Jun. 11, 2002

(54) BAND PASS FILTER WITH IMPROVED GROUP DELAY

(75) Inventor: Samuel L. Thomasson, Gilbert, AZ (US)

(73) Assignee: Acoustic Technologies, Inc., Mesa, AZ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/492,015

(22) Filed: Jan. 26, 2000

(51) Int. Cl.$^7$ ................................................ H03K 5/00
(52) U.S. Cl. .................... 327/557; 327/552; 327/556
(58) Field of Search ................................ 327/552, 553, 327/558, 557

(56) References Cited

U.S. PATENT DOCUMENTS

| 5,107,491 A | * | 4/1992 | Chew | 370/85.3 |
| 5,662,118 A | * | 9/1997 | Skubick | 128/733 |
| 5,717,772 A | * | 2/1998 | Lane et al. | 381/93 |

OTHER PUBLICATIONS

"Electronic Filter Design Handbook," A.B. Williams and F.J. Taylor, 3rd Ed., McGraw–Hill, Inc. (1995), pp. 5.42–5.46, 6.38–6.39, 7.21–7.27 & 7.30.

"Radio Engineering," Terman, McGraw–Hill Book Company (1937), pp. 76–85.

* cited by examiner

*Primary Examiner*—Dinh T. Le
(74) *Attorney, Agent, or Firm*—Paul F. Wille

(57) ABSTRACT

An electrical signal is applied to a band pass filter, a first notch filter, and a second notch filter in any order. The center frequencies of the notch filters straddle the pass band of the band pass filter. The notch filters improve group delay and steepen the skirts of the response curve of the band pass filter.

9 Claims, 2 Drawing Sheets

BAND PASS FILTER WITH IMPROVED GROUP DELAY

CROSS-REFERENCE TO RELATED APPLICATIONS

This application includes material disclosed in the following applications assigned to the assignee of this invention. The entire contents of each of these co-pending applications are incorporated herein by reference.

(1) Application No. 09/466,313 filed Dec. 17, 1999, entitled "Band Pass Filter from Two Notch Filters".

(2) Application No. 09/491,998, filed concurrently herewith, and entitled "Band Pass Filter from Two Filters".

BACKGROUND OF THE INVENTION

This invention relates to a filter circuit and, in particular, to an analog band pass filter having a more uniform group delay than such filters in the prior art.

Band pass filters have been used, alone or combined, in a host of applications virtually since the beginning of the electronic industry. The continuing problem in any application is providing a band pass filter having the desired frequency response. It is known in the art that a band pass filter can include a pair of series coupled resonant circuits that are "de-tuned", i.e. have slightly different resonant frequencies. See for example, *"Radio Engineering"* by Terman, McGraw-Hill Book Company, New York, 1937, pages 76–85.

Today, a band pass filter can be implemented in any one of several technologies. For example, passive analog filters utilize resistors, capacitors, and inductors to achieve the desired frequency response. Active filters add one or more operational amplifiers to prevent a signal from becoming too attenuated by the passive components and to exaggerate or to minimize a particular response by controlled feedback. Switched capacitor circuits are basically analog circuits but divide a signal into discrete samples and, therefore, have some attributes of digital circuits.

Finite Impulse Response (FIR) filters are completely digital, using a shift register with a plurality of taps. An FIR filter generally has a linear phase versus frequency response and a constant group delay. As such, FIR filters find widespread use in digital communication systems, speech processing, image processing, spectral analysis, and other areas where non-linear phase response is unacceptable.

A problem using FIR filters is the number of samples versus the delay in processing a signal. In order to obtain a high roll-off, i.e. a nearly vertical skirt on the response curve, a very large number of taps is necessary. Although the group delay is constant, it is relatively large, ten to fifteen times that of an analog filter, because of the large number of taps. Another problem with FIR filters is ripple, which typically exceeds 3 decibels (dB). There are other digital circuits that could be considered filters but these circuits either do not operate in "real time" or have such long processing times that the delays limit the utility of the techniques.

It is known in the art to use delay equalizers to improve the uniformity of the delay of a band pass filter; e.g. see *"Electronic Filter Design Handbook"* by Williams and Taylor, Third Edition, McGraw-Hill, Inc., 1995, pages 7.21–7.27 and 7.30. The effect on frequency response of adding such equalizers is not described.

Obtaining a sharp roll-off from an analog filter is often difficult, particularly for narrow band filters, e.g. one third octave or less. Even with active elements, good filters tend to be complex and, therefore, expensive. As noted above, FIR filters can provide a sharp roll-off but typically suffer from long group delay, making an FIR filter unsuitable in telephone systems, for example.

Frequency response, phase shift linearity, group delay, ripple, and roll-off are characteristics of all filters, whether or not the characteristic is mentioned in a particular application. The Q, or sharpness, of a filter circuit is often specified as the ratio of the center frequency to the band width at −3 dB. A problem with this definition is that the roll-off on each side of the center frequency is assumed to be symmetrical (when amplitude is plotted against the logarithm of frequency). Another assumption is that the skirts of the response curves of two filters are similar. If the assumption is not valid, then comparing one filter to another becomes difficult.

In view of the foregoing, it is therefore an object of the invention to provide an analog band pass filter having short, relatively constant, group delay Another object of the invention is to provide an analog band pass filter that is relatively inexpensive despite improved performance when compared with filters of the prior art.

A further object of the invention is to provide an analog band pass filter having higher Q than such filters in the prior art.

SUMMARY OF THE INVENTION

The foregoing objects are achieved in this invention in which an electrical signal is applied to a band pass filter, a first notch filter, and a second notch filter in any order. The center frequencies of the notch filters straddle the pass band of the band pass filter. The notch filters improve group delay and steepen the skirts of the response curve of the band pass filter. The invention can be implemented with analog filters, IIR (Infinite Impulse Response) filters, bi-quad filters, or switched-C filters.

BRIEF DESCRIPTION OF THE DRAWINGS

A more complete understanding of the invention can be obtained by considering the following detailed description in conjunction with the accompanying drawings, in which.

DETAILED DESCRIPTION OF THE INVENTION

Figure 1:
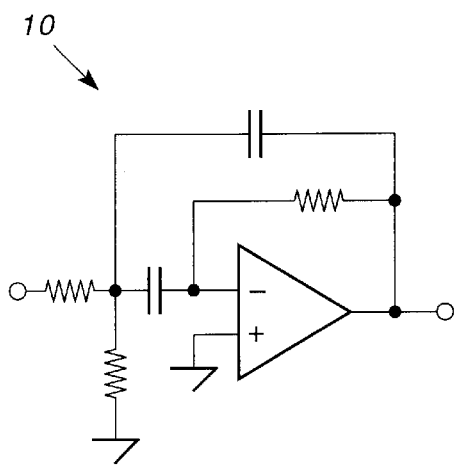
FIG. 1 is a schematic of a band pass filter of the prior art.

FIG. 1 is a schematic of a band pass filter known in the art. Filter 10 is known as a multiple feedback band pass circuit; see *"Electronic Filter Design Handbook"* by Williams and Taylor, Third Edition, McGraw-Hill, Inc., 1995, page 5.42–5.46.

Figure 2:
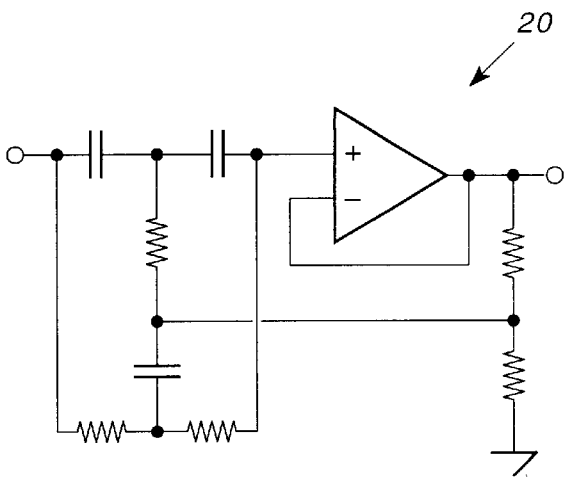
FIG. 2 is a schematic of a notch filter of the prior art.

FIG. 2 is a schematic of a notch filter known as a twin-T filter with positive feedback; see the Williams and Taylor text, pages 6.38 and 6.39. This particular filter was chosen because of its simplicity, depth of notch, and because the gain can be adjusted easily.

Figure 3:
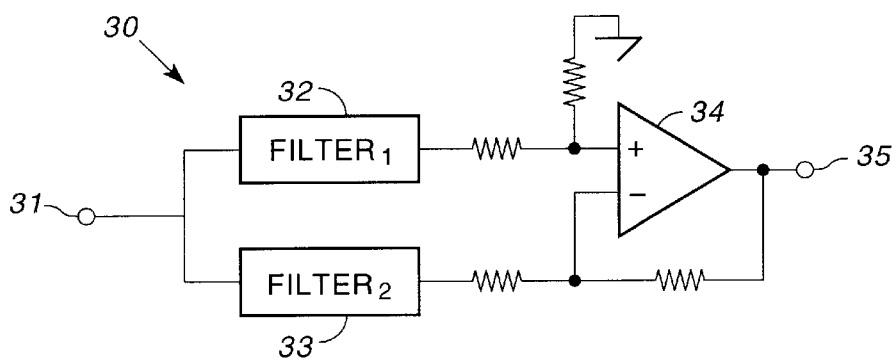
FIG. 3 is a partial block diagram of a band pass filter constructed in accordance with one aspect of the invention.

FIG. 3 illustrates an analog band pass filter constructed in accordance with a preferred embodiment of the invention. Band pass filter 30 includes a pair of filter channels coupled to a difference amplifier. Specifically, input 31 is coupled to filter 32 and filter 33, which are the same type of filter, band pass or notch, but have slightly offset center frequencies. Preferably, the frequency response curve for filter 32 intersects the frequency response curve for filter 33 at −3 dB or less. This prevents the frequency response curve of filter 30 from having more than one peak. The output of filter 32 is coupled to a non-inverting input of filter 34 and the output of filter 33 is coupled to an inverting input of filter 34. The resistors shown all have the same value, e.g. 10kΩ.

Using a notch filter constructed as shown in FIG. 2 for each of filters 32 and 33, one obtains the band pass filter described in cross-referenced application (1). Using a band pass filter constructed as shown in FIG. 1 for each of filters 32 and 33, one obtains a band pass filter as described in cross-referenced application (2). FIGS. 1 and 2 illustrate filters that are preferred but are not the only filters suitable for implementing the invention.

The signals from filters 32 and 33 are subtracted in amplifier 33, producing a band pass frequency response having a narrower pass band and steeper skirts than analog filters of the prior art. Despite this improvement over the prior art, the frequency response can be further narrowed and the group delay improved by using the filter illustrated in FIG. 4.

Figure 4:
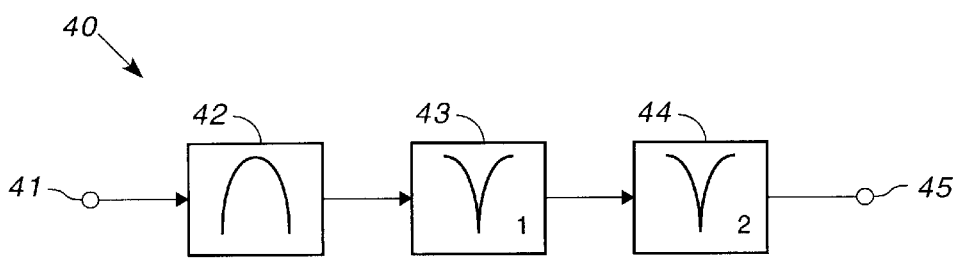
FIG. 4 is a block diagram of a band pass filter constructed in accordance with the invention.

In FIG. 4, band pass filter 40 includes input 41 coupled to band pass filter 42 having an output coupled to notch filter 43. Band pass filter 42 is preferably constructed as illustrated in FIG. 3, although the band pass filter illustrated in FIG. 1, or other analog band pass filters, could be used instead. Notch filter 43 has a notch frequency or center frequency below the pass band of filter 42. Notch filter 44 is coupled to the output of notch filter 43 and has a notch frequency above the pass band of filter 42. It does not matter what order filters 42, 43 and 44 are used.

As noted in the Background of the Invention, the prior art definition of "Q" leaves something to be desired, as does the definition of "pass band." One wants the frequency response to be as flat as possible within the pass band and the skirts to be as vertical as possible outside the pass band. Normalizing the response (setting maximum response to 0 dB) and defining the pass band as the region between the −3 dB points says nothing about the shape of the curve.

When using a band pass filter constructed as illustrated in FIG. 3, notch filters 42 and 43 preferably have center frequencies slightly outside the −10 dB points on the response curve. Using an ordinary band pass filter for filter 41, notch filters 42 and 43 preferably have center frequencies at least outside the −3 dB points on the response curve of the band pass filter.

Figure 5:
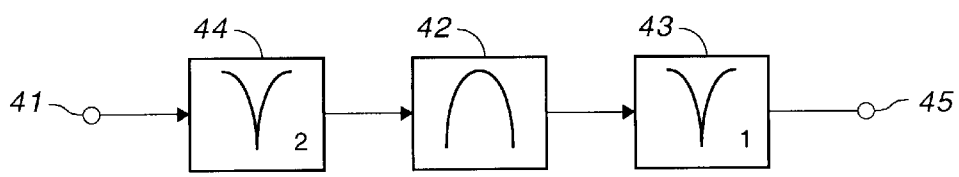
FIG. 5 is a block diagram of a band pass filter constructed in accordance with an alternative embodiment of the invention.

FIG. 5 illustrates an alternative embodiment of the invention. As noted above, the order in which the filters are placed does not matter. The results are the same. More specifically, all six permutations of the filters produce the same results.

Figure 6:
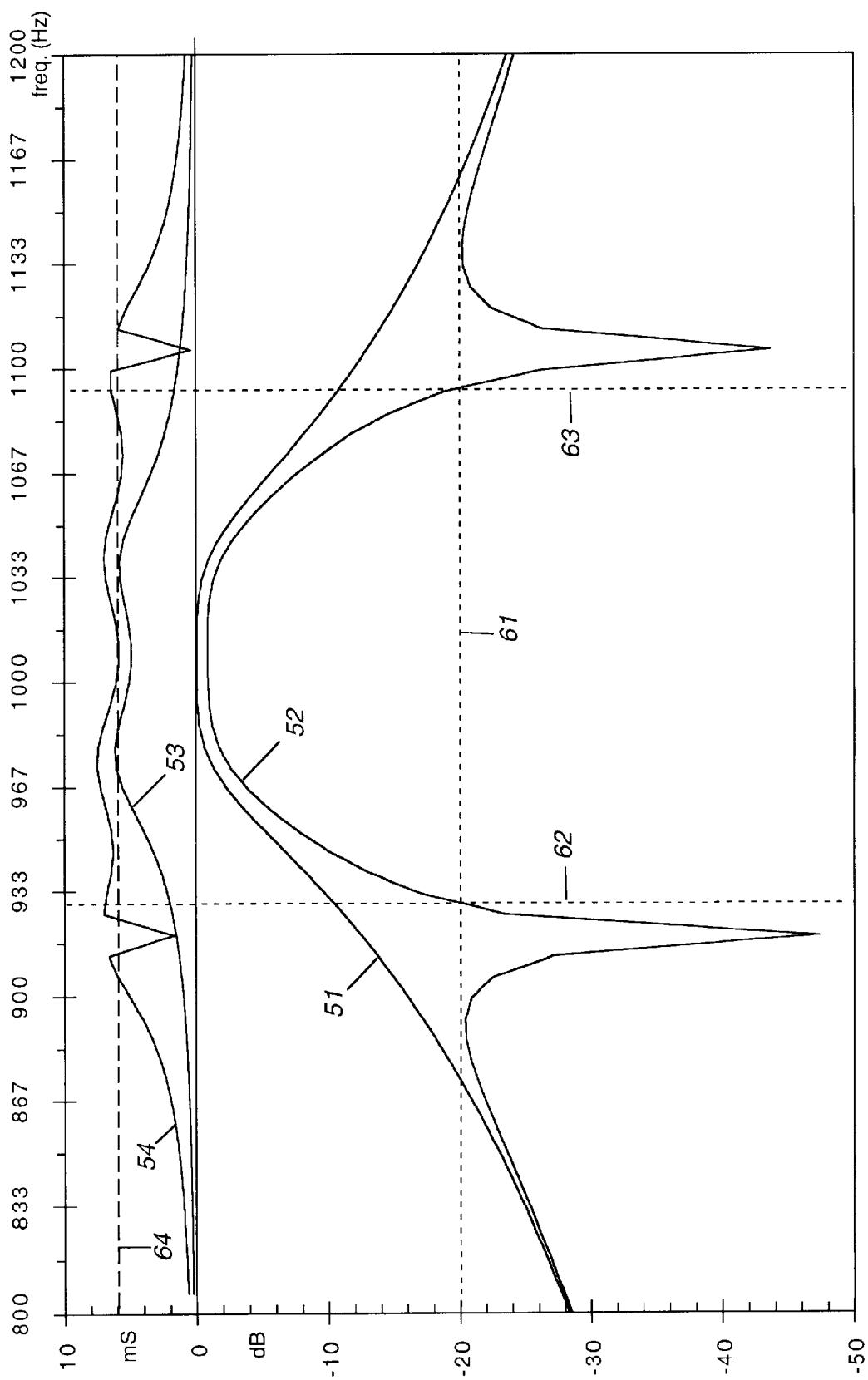
FIG. 6 is a chart comparing filters made in accordance with the invention with filters of the prior art.

FIG. 6 illustrates the effect of passing a signal through filters 42, 43 and 44. Curve 51 represents the frequency response of band pass filter 41, constructed in accordance with FIG. 3. Curve 52 represents the signal at output 45, i.e. the frequency response of band pass filter 40. Curve 53 represents the group delay of band pass filter 42. Curve 54 represents the group delay of band pass filter 40, except for the notches near dashed lines 62 and 63.

The notches in curve 54 are artifacts of the simulation and arise because of the small amplitude of signal at the notch frequencies and because of a small sample size. Although each curve in FIG. 6 is based upon six hundred data points, this is not a very large sample compared to what the simulation software could provide. The data was reduced for conversion to a spreadsheet program from which the curves were drawn. Ten thousand or more points would exceed the resolution of a printer and take a great deal of time to process. The notches in curve 52 are real.

As an aid to visualization, several straight, dashed lines are included in FIG. 6. The particular placement of these lines is not definitive of the invention. Line 61 shows the −20 dB level for curve 51. Vertical lines 62 and 63 were placed at the intersections of line 61 and curve 52, which is not normalized to zero dB. Horizontal line 64 is placed between curves 53 and 54 in the region between lines 62 and 63.

As can be seen, the range of the group delay is dramatically narrowed by the invention In the simulation upon which FIG. 6 is based, the ripple in curve 54 between lines 62 and 63 is less than 2 dB. In the art, a ripple of less than 3 dB is considered good. Note too that the uniformity in curve 54 extends past the −20 dB points on curve 52. Thus, there is very little power in any signal having a frequency outside lines 62 and 63. The slight increase in group delay is immaterial.

A greater consistency within the pass band makes filter 40 useful in many applications, including telephones and telephone systems. Implemented as an integrated circuit, a filter constructed in accordance with the invention is much less expensive than an FIR filter, for example.

The invention thus provides an analog band pass filter having short, relatively constant, group delay. The filter has higher Q than analog filters in the prior art and is relatively inexpensive despite improved performance when compared with analog filters of the prior art.

Having thus described the invention, it will be apparent to those of skill in the art that many modifications can be made within the scope of the invention. For example, although only a filter is shown in each channel in FIG. 3, other circuitry can be included in each channel. The outputs of the channels would be summed if the signal in one channel were inverted without also inverting the signal in the other channel. The invention can be implemented in several different technologies, including analog filters, IIR filters, bi-quad filters, and switched-C filters. The invention can be used for band pass filters of any center frequency from sub-audio through radio frequency.

What is claimed as the invention is:

1. A filter characterized by a band pass frequency response between an input and an output and by a short, relatively uniform group delay, said filter comprising:
   a band pass filter, a first notch filter, and a second notch filter coupled in series in any sequence between said input and said output,
   wherein the center frequency of the first notch filter is below the center frequency of the band pass filter and the center frequency of the second notch filter is above the center frequency of the band pass filter; and
   wherein the center frequency of the first notch filter lies within the −30 dB pass band of said band pass filter and the center frequency of the second notch filter lies within the −30 dB pass band of said band pass filter;
   whereby a relatively uniform group delay is provided across the pass band of said filter.

2. The filter as set forth in claim 1 wherein at least one of the notch filters is a twin-T active filter.

3. The filter as set forth in claim 1 and characterized by a ripple in the pass band of less than 3 dB.

4. The filter as set forth in claim 1 wherein said band pass filter includes:
   a first channel coupled to said input and including a first filter having a first center frequency;
   a second channel coupled to said input and including a second filter having a second center frequency;
   wherein the first center frequency and the second center frequency are not equal; and
   a difference amplifier coupled to said channels for subtracting the signals from the channels.

5. The filter as set forth in claim 4 wherein the frequency response of the first filter and the frequency response of the second filter intersect at approximately −3 dB or less.

6. The filter as set forth in claim 4 wherein said first filter in said band pass filter and said second filter in said band pass filter are each a notch filter.

7. The filter as set forth in claim 4 wherein said first filter in said band pass filter and said second filter in said band pass filter are each a band pass filter.

8. A method for processing an electrical signal, said method comprising the steps of:
   applying the electrical signal to a band pass filter to produce a first output signal;
   applying the first output signal to a first notch filter to produce a second output signal; and
   applying the second output signal to a second notch filter to produce a third output signal;
   whereby the response curve of the band pass filter has steeper skirts than without the notch filters and a relatively uniform group delay is obtained across the resulting pass band.

9. The method as set forth in claim 8 wherein the center frequencies of the notch filters straddle the pass band of the band pass filter.

* * * * *